(12) United States Patent  
Geissler et al.

(10) Patent No.: US 7,912,619 B2  
(45) Date of Patent: Mar. 22, 2011

(54) ENGINE REGULATION SYSTEM AND METHOD FOR QUALIFYING THE COMPONENTS OF THE ENGINE REGULATION SYSTEM

(75) Inventors: Armin Geissler, Karlsfeld (DE); Thomas Goeler, Germering (DE); Werner Riebesel, Poing (DE)

(73) Assignee: MTU Aero Engines GmbH, Munich (DE)

( * ) Notice: Subject to any disclaimer, the term of this patent is extended or adjusted under 35 U.S.C. 154(b) by 194 days.

(21) Appl. No.: 12/151,549

(22) Filed: May 7, 2008

(65) Prior Publication Data

US 2009/0276139 A1 Nov. 5, 2009

(30) Foreign Application Priority Data

Apr. 30, 2008 (DE) .......................... 10 2008 021 825  
May 7, 2008 (DE) .......................... 10 2008 022 620

(51) Int. Cl.  
*F02D 41/28* (2006.01)

(52) U.S. Cl. ..... 701/102; 701/114; 701/115; 73/114.61; 714/10; 714/11; 714/12

(58) Field of Classification Search .................. 701/102, 701/114, 115; 73/114.61; 714/10, 11, 12  
See application file for complete search history.

(56) References Cited

U.S. PATENT DOCUMENTS

| | | | | |
|---|---|---|---|---|
| 4,884,054 A * | 11/1989 | Moon, Sr. | | 340/457.4 |
| 5,344,544 A * | 9/1994 | North et al. | | 204/401 |
| 5,453,939 A * | 9/1995 | Hoffman et al. | | 702/183 |
| 5,875,760 A * | 3/1999 | Bauer et al. | | 123/397 |
| 5,980,081 A * | 11/1999 | Watari et al. | | 700/79 |
| 6,065,135 A * | 5/2000 | Marshall et al. | | 714/11 |
| 6,357,024 B1 * | 3/2002 | Dutton et al. | | 714/45 |
| 6,526,340 B1 * | 2/2003 | Reul et al. | | 701/29 |
| 6,704,628 B1 * | 3/2004 | Fennel et al. | | 701/29 |
| 7,272,476 B2 * | 9/2007 | Ortiz et al. | | 701/33 |
| 7,275,181 B2 * | 9/2007 | Staiger | | 714/13 |
| 7,437,605 B2 * | 10/2008 | Blevins, Sr. | | 714/11 |
| 7,603,471 B2 * | 10/2009 | Sodergren | | 709/230 |
| 7,650,274 B2 * | 1/2010 | Higuchi et al. | | 703/21 |
| 2002/0077782 A1 * | 6/2002 | Fruehling et al. | | 702/185 |
| 2005/0050387 A1 * | 3/2005 | Mariani et al. | | 714/13 |
| 2005/0083965 A1 * | 4/2005 | Sodergren | | 370/463 |
| 2006/0101402 A1 * | 5/2006 | Miller et al. | | 717/124 |

* cited by examiner

*Primary Examiner* — Erick Solis  
(74) *Attorney, Agent, or Firm* — Davidson, Davidson & Kappel, LLC

(57) ABSTRACT

An engine control system is provided having a control unit and a monitoring module. The monitoring module, together with the control unit, forms one structural unit and is designed as a detachable module having an independent electromagnetic shielding.

17 Claims, 3 Drawing Sheets

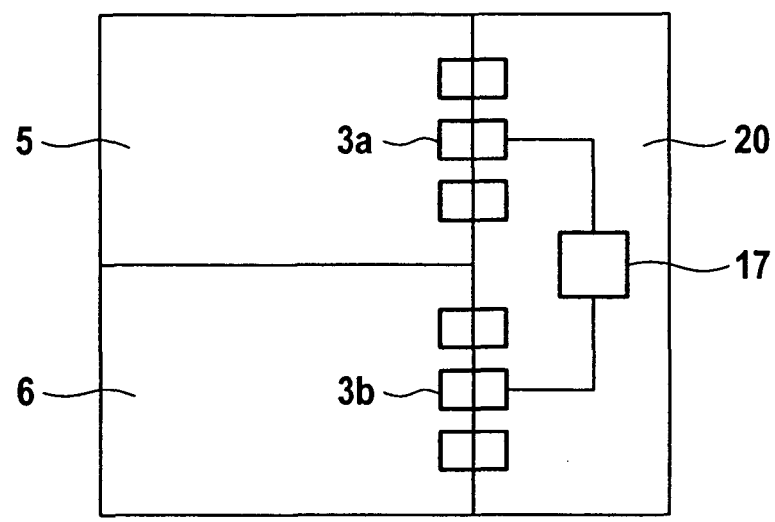
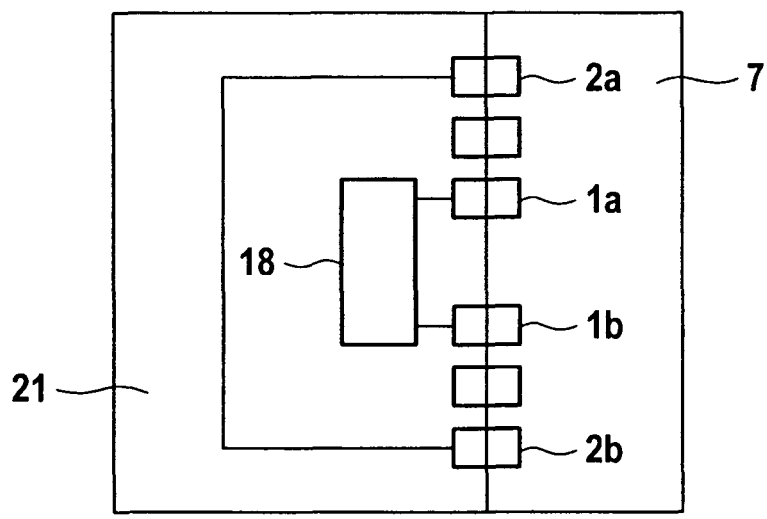
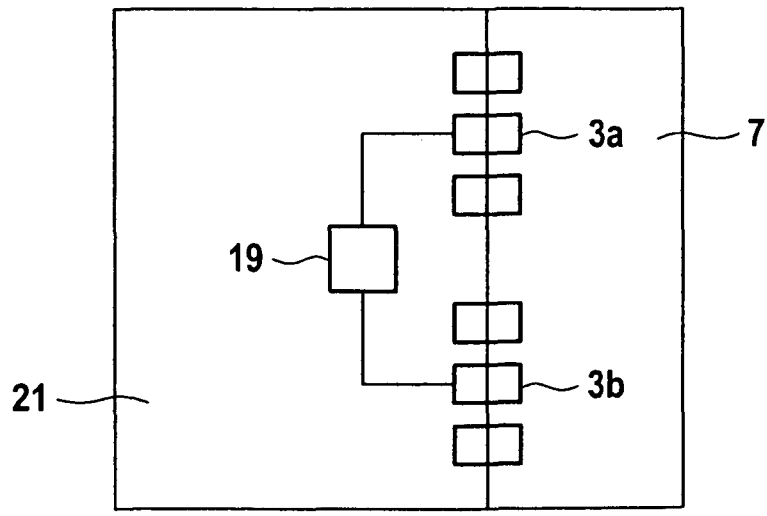

ND METHOD FOR QUALIFYING THE COMPONENTS OF THE ENGINE REGULATION SYSTEM

This claims priority to German Patent Applications DE 10 2008 021 825.1, filed Apr. 30, 2008 and DE 10 2008 022 620.3, filed May 7, 2008, the entire disclosures of which are hereby incorporated by reference herein.

FIELD OF THE INVENTION

The present invention relates to an engine control system having a control unit and a monitoring module and to a method for qualifying the components of the system.

BACKGROUND

Engine control systems are generally known. In this regard, reference is made thereto.

Engine control systems assume the task of controlling the operating parameters of the engine and of protecting the same from damage. Depending on the location of use, comprehensive qualification testing of the engine control system is required, including at least a test for electromagnetic compatibility and a vibration test.

Engine control systems include a control unit and a monitoring module, it being possible for the control unit itself to include a first and a second controller. This redundant design enhances operational reliability.

When working with such a system, there is always the need for the complete system to undergo qualification testing. It turns out, however, that, depending on the location of use, it is often the case that the same control unit, but different monitoring modules are required. Therefore, each individual monitoring module requires a relatively costly and time-consuming qualification procedure for the complete system.

For that reason, one approach has already provided for implementing the control unit and the monitoring module as separate devices, so that, should the monitoring module change, it is merely necessary for the separate monitoring module to undergo qualification testing.

However, separating the monitoring module from the control unit entails higher costs, as well as a heavier weight and a higher volume of the overall unit. Also, each modification to the monitoring module version necessitates performing at least the vibration test once again.

SUMMARY OF THE INVENTION

An object of the present invention is to devise an improved engine control system that will be able to overcome these problems. It is intended, moreover, to devise a suitable qualification method.

In terms of the engine control system, this objective is achieved by an embodiment of the present invention having a control unit and a monitoring module, which, together with the control unit, forms one structural unit and is designed as a detachable module having an independent electromagnetic shielding and, in terms of a monitoring module for the engine control system, by an embodiment of the present invention having a substantially closed housing for attenuating electromagnetic waves and a plug connector device for connection to a control unit. A suitable qualification method is indicated in an embodiment of the present invention wherein, for qualification purposes, the components, for which qualification testing is not actively pending are replaced by dummy components. Moreover, for this system, respectively this method, an embodiment of the present invention sets forth a suitable dummy monitoring system for connection to a control unit for an engine control system, which, for purposes of testing, has the same housing and the same plug connector device as a functional monitoring module. An embodiment of the present invention sets forth a dummy control unit for connection to a monitoring module for an engine control system, which, for test purposes, has the same housing and the same plug connector device as a functional control unit are provided.

The engine control system according to an embodiment of the present invention includes a control unit and a monitoring module, which, together with the control unit, forms one structural unit and is designed as a detachable module having an independent electromagnetic shielding. This makes it possible for the monitoring module to be modified as a function of the particular application, without having to requalify the complete system.

In another embodiment of the engine control system according to the present invention, the monitoring module and the control unit are interconnected via a communication interface which includes a galvanic separation.

This makes it possible for communication signals to be transmitted without potential errors, and for the transmission of electromagnetic interference signals from the monitoring unit to the control unit to be effectively prevented.

In another embodiment of the engine control system according to the present invention, the monitoring module and the control unit are interconnected via an analog interface which advantageously has a bidirectional design. A supplementary device made up of passive electrical circuit elements effectively prevents the transmission of electromagnetic interference signals from the monitoring unit to the control unit.

In another embodiment of the engine control system according to the present invention, the monitoring module is supplied with current from the control unit via a current interface, this power supply advantageously being designed to be short-circuit and no-load proof. A supplementary device made up of passive electrical circuit elements effectively prevents the transmission of electromagnetic interference signals from the monitoring unit to the control unit.

In another embodiment of the engine control system according to the present invention, the monitoring module is electrically and mechanically connected via a plug connector device to the control unit.

In another embodiment of the engine control system according to the present invention, the control unit has a first controller and a second controller, the first controller having a first communication interface, a first analog interface and a first current interface, and the second controller having a second communication interface, a second analog interface and a second current interface.

The monitoring module according to an embodiment of the present invention includes a substantially closed housing for attenuating electromagnetic waves and a plug connector device for connection to a control unit.

The dummy monitoring module provided for connection to a control unit for an engine control system according to an embodiment of the present invention has the same housing and the same plug connector device as a functional monitoring module.

In another embodiment of the dummy monitoring module according to an embodiment of the present invention, a resistor, which simulates the power consumption of the functional monitoring module, is provided for a first and second current interface, respectively.

In another embodiment of the dummy monitoring module according to an embodiment of the present invention, a first communication interface for a first controller is connected through to a second communication interface for a second controller.

In another embodiment of the dummy monitoring module according to an embodiment of the present invention, a first analog interface for a first controller of the control unit is connected via a first test circuit to a second analog interface for a second controller of the control unit.

The dummy control unit provided for connection to a monitoring module for an engine control system according to an embodiment of the present invention has the same housing and the same plug connector device as a functional control unit.

In another embodiment of the dummy control unit according to an embodiment of the present invention, a current source is provided which supplies the monitoring module with current via the first current interface and the second current interface.

In another embodiment of the dummy control unit according to an embodiment of the present invention, a first communication interface for a first controller device is connected through to a second communication interface for a second controller.

In another embodiment of the dummy control unit according to an embodiment of the present invention, an analog interface for a first controller is connected via a second test circuit to a second analog interface for a second controller.

In another embodiment of the dummy control unit according to an embodiment of the present invention the first analog interface, the second analog interface, the first communication interface, the second communication interface, the first current interface and the second current interface are interconnected to determine the minimum attenuation using measurement processes.

In the method for qualifying the individual components of an engine control system according to an embodiment of the present invention, the components, for which qualification testing is not actively pending, are replaced by dummy components for qualification purposes.

In another embodiment of the method for qualifying the individual components of an engine control system according to the present invention, the dummy components simulate those functions of the components they have replaced which are required for the particular qualification.

BRIEF DESCRIPTION OF THE DRAWINGS

The present invention is described in greater detail in the following with reference to the figures without being limited thereto.

FIGS. 2 and 3 show schematically a control unit which is coupled to a dummy monitoring module.

FIGS. 4 and 5 show schematically a monitoring module which is coupled to a dummy control unit.

Figure 1:
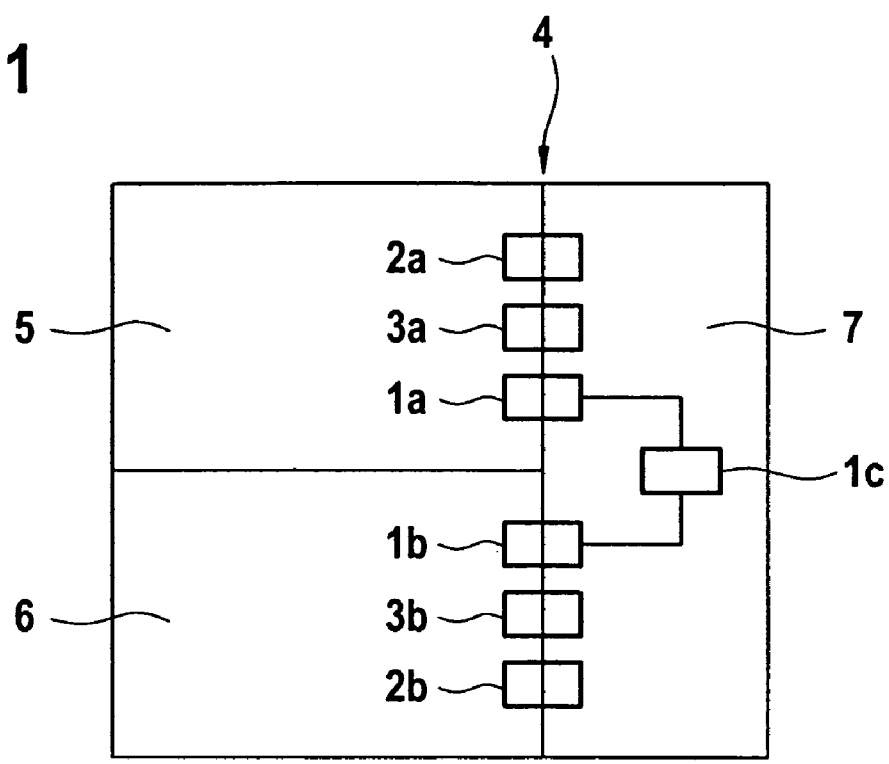
FIG. 1 shows schematically the configuration of the components of an engine control system.

The monitoring module features an electromechanical separation from the control unit which is not discernible in the figure.

DETAILED DESCRIPTION

In the figures, $1a$ and $1b$ denote a first, respectively a second current interface; $1c$ the power consolidation in the monitoring module; $2a$ and $2b$ a first, respectively a second communication interface; and $3a$ and $3b$ a first, respectively a second analog interface. In addition, reference numerals 5 and 6 denote a first and a second controller, which, together, constitute control unit 5, 6; reference numeral 7 denotes a monitoring module; and reference numeral 4 an electromechanical separation between control unit 5, 6 and monitoring module 7. Moreover, reference numerals $12a$ and $12b$ denote a first and second plug connector device, respectively; reference numerals 14 and 15 the housing of control unit 5, 6, respectively of monitoring module 7; reference numeral 16 a resistor; and reference numerals 17 and 19 a first and a second test circuit. Finally, reference numeral 18 also denotes a current source; 20 a dummy monitoring module; and $21a$ dummy control unit.

Figure 6:
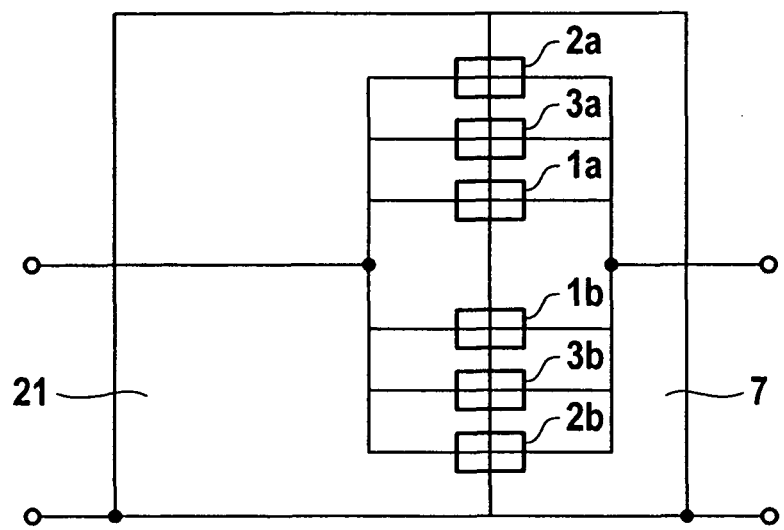
FIG. 6 shows schematically the determination of the minimum attenuation according to an embodiment of the present invention wherein a first analog interface, a second analog interface, a first communication interface, a second communication interface, a first current interface and a second current interface are interconnected.
Figure 7:
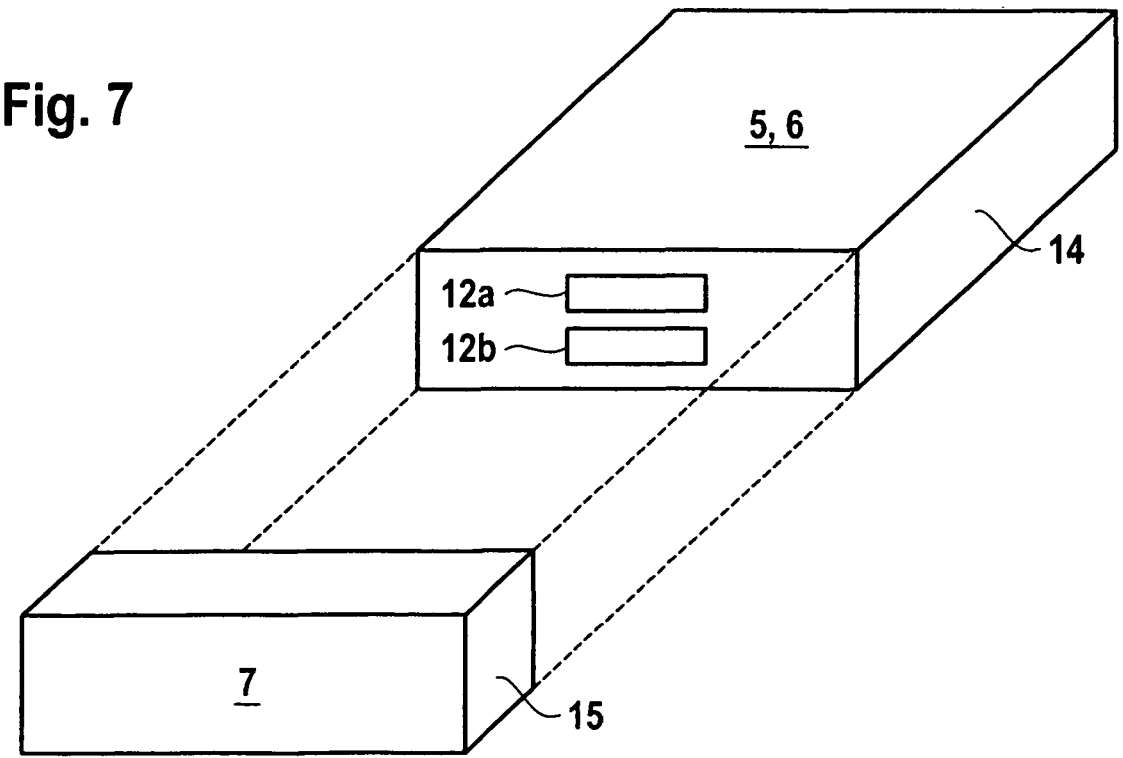
FIG. 7 shows schematically and in a perspective representation an exemplary embodiment of an engine control system.

In FIGS. 1 through 6, the components of the engine control system are interconnected, whereas they are shown in a disassociated view in FIG. 7.

The control unit and the monitoring module may be electromechanically separated from one another.

The mechanical connection is accomplished using screws (not shown).

The electrical separation is carried out via plug connector device $12a$ and $12b$, which is apparent from FIG. 7 with respect to control unit 5, 6. Monitoring module 7 likewise has a corresponding plug connector device which is not discernible in the figure and which, in the state in which monitoring module 7 is connected to control unit 5, 6, is in electrical contact with plug connector device $12a$, $12b$ of control unit 5, 6.

First plug connector device $12a$ contacts first controller 5 via monitoring module 7, whereas second plug connector device $12b$ contacts second controller 6 via monitoring module 7. In this context, first plug connector device $12a$ implements first current interface $1a$, first communication interface $2a$ and first analog interface $3a$, whereas second plug connector device $12b$ implements second current interface $1b$, second communication interface $2b$ and second analog interface $3b$.

Current interfaces $1a$, $1b$ supply power from first and second controller 5 and 6, respectively, to the monitoring module. Power is consolidated in the monitoring module. The power supply in first and second controller 5 and 6, respectively, or the power consolidation in the monitoring module is designed to be short-circuit and no-load proof. In the process, emissions are blocked by filters, for example. This interface is realized by passive, components and without logic modules.

Both first communication interface $2a$, as well as second communication interface $2b$ maintain galvanic separation of control unit 5, 6 from the monitoring module. Here as well, emissions are blocked through the use of filters, for example. The communication interface is implemented by passive components without the use of logic modules.

The analog interfaces are used for rapidly exchanging predefined operating parameters, such as vibration and speed signals, for example, between monitoring module 7 and control unit 5, 6. These interfaces also have filters for purposes of blocking emissions and are implemented without logic modules and with passive components.

Figure 2:
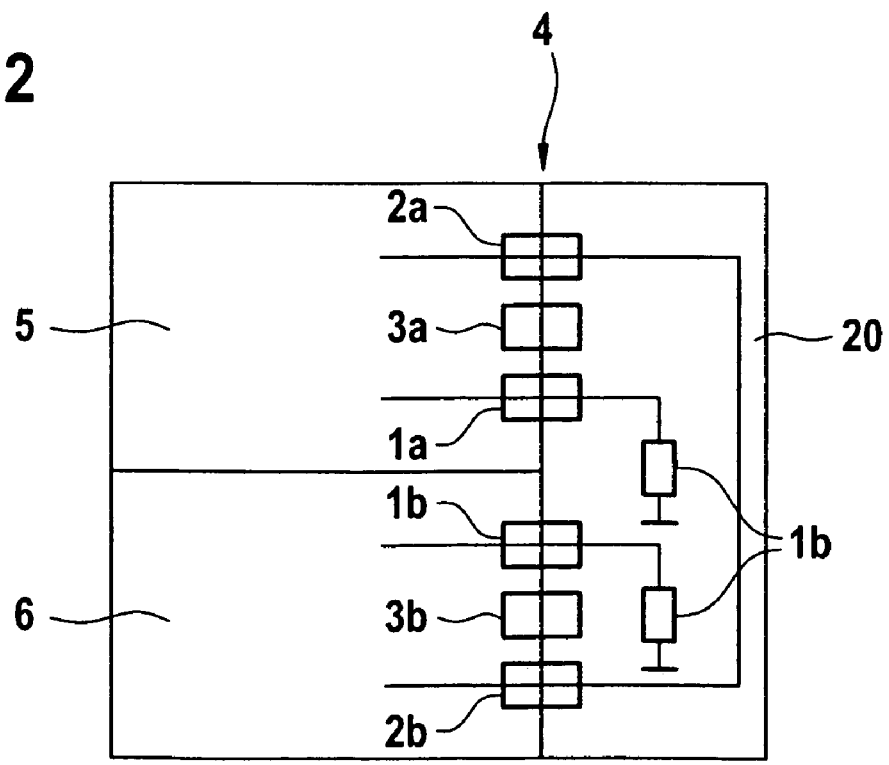

FIGS. 2 and 3 illustrate a control unit 4, 5, which, for qualification purposes, particularly with respect to the electromagnetic compatibility, is combined with a dummy monitoring module 20.

To simulate the power consolidation function, for each controller 5, 6, dummy monitoring module 20 has a separate resistor which simulates the consumption characteristics of the functional monitoring module. Moreover, for test purposes, communication interface 2a is connected through to communication interface 2b.

In FIG. 3, between first analog interface 31 and second analog interface 3b, first test circuit 17 is provided which makes it possible to ascertain whether analog signals, which are clearly defined in advance, stay within preset limits during the test.

In FIGS. 4, 5 and 6, a functional monitoring module 7 is shown for test purposes along with a dummy control unit 21.

In this context, in FIG. 4, current source 18, for example in the form of a battery, assumes the task of supplying power to functional monitoring module 7. First communication interface 2a is also connected through to second communication interface 2b.

In FIG. 5, first analog interface 3a is connected via a second test circuit 19 to second analog interface 3b. Second test circuit 19 performs a function comparable to that of test circuit 17 in accordance with FIG. 3.

To determine the transfer function between dummy control unit 21 and monitoring module 7, in the case of dummy control unit 21 according to FIG. 6 and monitoring module 7, all of the interfaces are interconnected. This makes it possible for a vectorial network analyzer to perform a multiport measurement to determine the minimum attenuation, respectively to test whether it is above 80 db.

As shown in FIG. 7, monitoring module 7 is interconnectable with control unit 5, 6. Both components have a housing which protects from electromagnetic radiation. Iron or other electrically conductive materials are particularly suited for this purpose.

In the assembled state, the housing is completely closed off from electromagnetic radiation. In the disassembled state, this is not necessarily the case.

The present invention was described above with reference to the use of a control unit having a first and second controller. However, the number of controllers is not limited to two. The present invention may likewise be implemented using a control unit having one or three or more controllers.

The present invention was described above with reference to the use of three separate interfaces, namely a current interface, a communication interface and an analog interface. However, it is not limited to such a number of interfaces. Rather, the number of interfaces is in accordance with the function of the monitoring module. The same holds for the number of plug connector devices.

What is claimed is:

1. An engine control system comprising:
a control unit; and
a monitoring module, the monitoring module and the control unit together forming one structural unit, the monitoring module being a detachable module, detachable from the control unit and having an independent electromagnetic shielding from the control unit, wherein the monitoring module and the control unit are interconnected via a communication interface which includes a galvanic separation.

2. An engine control system comprising:
a control unit; and
a monitoring module, the monitoring module and the control unit together forming one structural unit, the monitoring module being a detachable module, detachable from the control unit and having an independent electromagnetic shielding from the control unit, wherein the monitoring module is supplied with current from the control unit via a current interface, a power supply in the control unit or a power consolidation in the monitoring module being designed to be short-circuit and no-load proof.

3. The engine control system as recited in claim 1, wherein the monitoring module is connected via a plug connector device to the control unit.

4. The engine control system as recited in claim 1, wherein the control unit has a first controller and a second controller, the first controller having a first communication interface, a first analog interface and a first current interface, and the second controller having a second communication interface, a second analog interface and a second current interface.

5. A dummy monitoring module for connection to a control unit for an engine control system, the engine control system comprising: a control unit; and a functioning monitoring module, the functioning monitoring module and the control unit together forming one structural unit, the functioning monitoring module being a detachable module, detachable from the control unit and having an independent electromagnetic shielding from the control unit, the dummy monitoring module, for purposes of testing, having the same housing and the same plug connector device as the functional monitoring module.

6. The dummy monitoring module as recited in claim 5, wherein a resistor, simulating the power consumption of the functional monitoring module, is provided for a first current interface and second current interface.

7. The dummy monitoring module as recited in claim 5, wherein a first communication interface for a first controller is connected through to second communication interface for a second controller.

8. The dummy monitoring module as recited in claim 5, wherein a first analog interface for a first controller of the control unit is connected via a first test circuit to a second analog interface for a second controller of the control unit.

9. A dummy control unit for connection to a monitoring module for an engine control system, the engine control system comprising: a functioning control unit; and a monitoring module, the monitoring module and the functional control unit together forming one structural unit, the monitoring module being a detachable module, detachable from the functional control unit and having an independent electromagnetic shielding from the functional control unit, the dummy control unit, for test purposes, having the same housing and the same plug connector device as a functional control unit.

10. The dummy control unit as recited in claim 9, wherein a current source is provided which supplies the monitoring module with current via a first current interface and a second current interface.

11. The dummy control unit as recited in claim 9, wherein a first communication interface for a first controller is connected through to a second communication interface for a second controller.

12. The dummy control unit as recited in claim 9, wherein an analog interface for a first controller is connected via a second test circuit to a second analog interface for a second controller.

13. The dummy control unit as recited in claim 9, wherein, to determine a minimum attenuation, a first analog interface, a second analog interface, a first communication interface, a second communication interface, a first current interface and a second current interface are interconnected.

14. A method for qualifying the individual components of an engine control system, the engine control system comprising: a control unit; and a monitoring module, the monitoring module and the control unit together forming one structural unit, the monitoring module being a detachable module, detachable from the control unit and having an independent electromagnetic shielding from the control unit, in which, for qualification purposes, any components, for which qualification testing is not actively pending are replaced by dummy components.

15. The method as recited in claim 14, wherein the dummy components simulate those functions of the components they have replaced which are required for the particular qualification.

16. The engine control system as recited in claim 2, wherein the monitoring module is connected via a plug connector device to the control unit.

17. The engine control system as recited in claim 2, wherein the control unit has a first controller and a second controller, the first controller having a first communication interface, a first analog interface and a first current interface, and the second controller having a second communication interface, a second analog interface and a second current interface.

* * * * *